United States Patent [19]
Heiblum et al.

[11] Patent Number: 5,132,760
[45] Date of Patent: Jul. 21, 1992

[54] ELECTRON WAVE DEFLECTION IN MODULATION DOPED AND OTHER DOPED SEMICONDUCTOR STRUCTURES

[76] Inventors: Mordehai Heiblum, 2375 Mark Rd.; Uri Sivan, 3064B Ferncrest Dr., both of Yorktown Heights, N.Y. 10598; Corwin P. Umbach, 144 Deerfield Rd., RFD #3, Katonah, N.Y. 10536

[21] Appl. No.: 708,080

[22] Filed: May 24, 1991

Related U.S. Application Data

[63] Continuation of Ser. No. 400,416, Aug. 30, 1989, abandoned.

[51] Int. Cl.$^5$ .............................................. H01L 27/14
[52] U.S. Cl. ........................................ 357/30; 357/68; 357/22; 357/16; 357/15
[58] Field of Search ................. 357/22 A, 22 MD, 68, 357/16, 20, 15

[56] References Cited

U.S. PATENT DOCUMENTS

| | | | |
|---|---|---|---|
| 3,319,082 | 5/1967 | Touchy | 357/68 X |
| 3,501,681 | 3/1970 | Weir | 357/68 X |
| 3,593,071 | 7/1971 | Janning | 357/68 X |
| 4,529,999 | 7/1985 | Bender et al. | 357/68 X |
| 4,546,453 | 10/1985 | Noufer | 357/68 X |
| 4,550,330 | 10/1985 | Fowler | 357/16 |

FOREIGN PATENT DOCUMENTS 61-159769 7/1986 Japan ....................... 357/22 MD
61-160978 7/1986 Japan ....................... 357/22 MD

OTHER PUBLICATIONS

*IBM Technical Disclosure Bulletin*, vol. 31, No. 8, Jan. 1989, pp. 150-152, "Heterostructure Traveling Wave Transistor", F. F. Fang et al.

*Primary Examiner*—William Mintel

[57] ABSTRACT

The present invention relates to semiconductor devices which incorporate doped semiconductor elements or modulation doped devices wherein ballistic electrons in these elements or in a two-dimensional electron gas (2-DEG) are deflected by shaped potential barriers. A shaped potential barrier is formed by depositing a shaped electrode on the surface of the device and applying a potential to it. The electrode may take the shape of a biconcave lens which induces a potential barrier of that shape in the underlying device. Upon transiting the potential barrier induced by the shaped electrode, the phases of the exiting electrons are different across the width of the electrode and the beam of electrons is focused. By changing the applied potential, the focal point of the exiting electrons may be moved in a direction parallel to the axis of the lens-like electrode. Other electrode configurations such as a biconvex shape will cause incident electrons to diverge from their original paths. In another embodiment, a triangular electrode, depending on the potentials applied to it, reflects, transmits or deflects incident electron waves.

46 Claims, 4 Drawing Sheets

ELECTRON WAVE DEFLECTION IN MODULATION DOPED AND OTHER DOPED SEMICONDUCTOR STRUCTURES

This invention was made with Government support under N000 14-87-C-0709 awarded by the Department of the Navy. The Government has certain rights in this invention.

This application is a continuation of application Ser. No. 07/400,014 filed Aug. 30, 1989. now abandoned

DESCRIPTION

1. Field of the Invention

This invention relates generally to doped semiconductor devices and more specifically to modulation doped structures wherein carriers introduced into a doped semiconductor or into a two-dimensional carrier gas are controlled both by the shape of an overlying electrode and by the magnitude and polarity of a potential applied to the electrode. To the extent that ballistic electrons can be described in terms of their wave-like characteristics, they have wavelength and phase and, as such, both of these parameters can be controlled by the action of a potential barrier applied by an electrode having the desired morphology. Thus, a metal or doped semiconductor gate electrode having a biconcave shape will focus electron waves impinging on one side thereof to a point upon transiting the shaped potential barrier provided by the shaped electrode. By changing the magnitude of the voltage applied to the gate electrode, the focal point will be moved along the axis of the lens-like electrode. An electrode having a biconvex shape, on the other hand, causes carriers to diverge away from their original path when they encounter a potential barrier shaped by an electrode of that kind. Other electrode shapes, like a triangular electrode, influence the path in which carriers travel and, with the proper potentials applied to such gate electrodes, current may be directed to one or more collector electrodes or totally reflected. In this way, circuits connected to such collector electrodes may be selectively activated to provide what may be termed logic inputs to such circuits.

BACKGROUND OF THE INVENTION

In the prior art, the propagation of electron waves in modulation doped structures is well-known. U.S. Pat. No. 4,550,330, filed Jun. 29, 1984 shows an interferometer structure wherein a bifurcated branch conductive path coplanar with a heterojunction in a semiconductor has a two-dimensional electron gas (2-DEG) formed adjacent the heterojunction so that electron waves can be launched into and travel in the 2-DEG. In addition, the reference shows a means for inducing a potential barrier such that the wavelength and phase of the electron waves transiting it are changed. In this arangement, all the electron waves which exit the potential barrier have the same wavelength and phase. There is no indication in this reference that electron waves traversing a potential barrier may be acted on in such a way that the phases and wavelengths of the exiting electron waves may be different. Similarly, in a copending application, Ser. No. 06/854,635 filed Apr. 22, 1986 and assigned to the same assignee as the present application, a tunable stub is shown in which a potential barrier is induced in an underlying heterojunction semiconductor arrangement by a gate structure, such that the wavelength and phase of electron waves transiting the barrier are all affected the same way. There is no indication in this reference that the phase and wavelength of the impinging electron wavesd may be controlled by controlling the slopes of the potential barrier at the points where the electron waves impinge.

IBM Technical Disclosure Bullentin, Vol. 31, No. 8, Jan. 1989, page 150, in an article entitled "Heterostructure Traveling Wave Transistor" by F. Fang and T. P. Smith, III, there is shown an interdigitated comb gate disposed over a 2-DEG. When the comb gate has a potential applied to it, potential barriers are induced in the underlying heterostructure such that electron waves launched in the 2-DEG encounter periodically varying potential barriers. These barriers are all aligned in such a way that electron waves transiting a given barrier all exdperience the same change in wavelength and phase across the width of the induced barrier. There is no indication in this reference of how the wavelength and phase of the electron waves may be varied across the width of a potential barrier.

It is, therefore, an object of the present invention to provide a ballistic transport semiconductor device in which a shaped electrode induces a shaped potential barrier such that electron waves transiting the potential barrier are each affected differently.

Another object is to provide a ballistic transport semiconductor or quantum mechanical effect device in which the slopese of the induced potential barrier affect different electron waves differently such that the electron waves are deflected from their original paths.

Still another object is to provide a ballistic transport semiconductor quantum mechanical device wherein gate electrodes having curved edges induce similarly curved potential barriers such that parallel electron waves impinging on the curved potential barriers are focused or diverge from their initial paths.

Yet another object is to provide a ballistic transport semiconductor quantum mechanical device wherein, relative to the path of an impinging electron wave, the slope of an induced potential barrier at the point of impingement determines the amount of deflection and, therefore, the ultimate destination of the electron wave.

These and other objects, features and advantages of the present invention will become more apparent from the following particular description of the preferred embodiments taken in conjunction with following briefly described drawings.

BRIEF DESCRIPTION OF THE DRAWINGS

FIG. 2 shows a heterojunction structure in which a two-dimensional carrier gas is formed adjacent the heterojunction. The sheet-like carrier gas acts as a conductor of electron waves.

FIG, 5 is a plan view of a semiconductor structure in which injected electron waves are subjected to a shaped potential barrier having curvatures such that the electron waves are caused to diverge. The shaped potential barrier is provided by an elecrode havintg the same shape as the shaped potential barrier. A voltage source controls the potentials applied to the electrode

BRIEF SUMMARY OF THE INVENTION

The present invention relates to smeiconductor device which incorporate droped semiconductor elements or modulation doped devices wherein ballistic electrons in these elements or in two-dimensional electron gas (2-DEG) are deflected by shaped potential barriers. In a preferred approach, a sandwich of GaAs and GaAlAs forms a 2-DEG adjacent the heterojunction in a well-known way. A lens is formed by depositing or growing a shaped electrode on the surface of the sandwich. The electrode may take the shape of a biconcave lens which includes a potential barrier of that shape in the underlying sandwich. When the electrons encounter the potential barrier, the excess energy of the ballistic electrons changes and so does their wavelength. Upon transiting the potential barrier induced by the shaped electrode, the phases of the exiting electrons are different acrosss the width of the electrode and the beam of electrons is focused into a tight region. By changing the applied potential, the focal point of the exiting electrons may be moved in a direction parallel to the axis of the lens-like electrode. If the incidence of the electron beam is displaced off-axis, the focal point will also be displaced off-axis. Other electrode configuration like a biconvex shape will cause incident electrons to diverge from their original paths. In both of the above described embodiments, the potential barrier induced may be of such magnitude that the impinging electron waves are totally reflected.

In another embodiment, the lens-like electrodes are replaced by triangular electrode through which electron waves are injected from an injector contact where, depending on the potentials applied to the triangular electrode, the incident electron waves are reflected, transmitted along their orginal path or transmitted and deflected from their original path. Then, depending on the positioning of collector electrodes, one of a plurality of such electrodes, either in the original path or in a different path displaced from the original path, will be intercepted by the exiting electron beam.

The above structures can be fabricated using well-known photolithographic and etching techiques in spite of the fact that the dimensions involved are of the order of mean free path of an electron in a semiconductor such as GaAs. At cryogenic temperatures, like the temperature of liquid helium (4.2° K ), the mean free of such electrons is in the micrometer range and, as such, the diminensions involved are larger than at ehr higher temperatures. The carriers involved are not limited to electrons. Holes whick form a two-dimensional hole gas instead of a 2-DEG, through their mean free path is much smaller, may also be used with the appropriately shaped electrode and potential polarity in the practice of the present invention.

DESCRIPTION OF THE PREFERRED EMBODIMENTS

Figure 1:
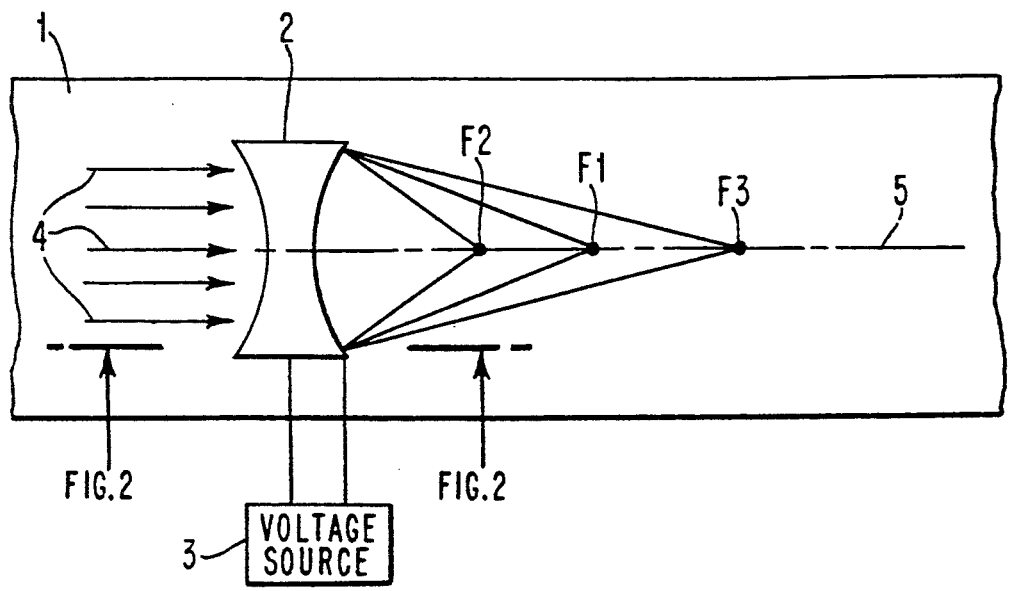
FIG. 1 is a plan view of a semiconductor structure in which injected electron waves are subject to a shaped potential barrier such that the electron waves are focused to a point. The shape potential barrier is provided by an electrode having the same shape as the shaped potential barrier. A voltage source applies potentials to the electrode which control the focal point.

Referring FIG. 1, there is shown therein a plan view of a semiconductor structure in which injected electron waves are subjected to a shaped potential barrier such that the electron waves are focused. The shaped potential barrier is provided by an electrode having the same morphology as the shaped potential barrier.

In FIG. 1, a semiconductor substrate 1 has a metallic or doped semiconductor electrode 2 desposited on its surface. Electrode 2 is connected to a voltage source 3 such that a potential barrier having the same shape as electrode 2 is induced in substrate 1. In FIG. 1, electrode 2 has a biconcave shape. Electrons injected into substrate 1 from a source (not shown) have wave-like characteristics represented in FIG. 1 by arrows 4 are directed through the shaped potential barrier in a direction parallel to axis 5. Because of the shape of the potential barrier, the electron waves are incident on the potential barrier at different angles depending on their position along the lens, and exit from it at different angles such that the overall effect is to focus the electron waves at a focal point on axis 5. If the potential from voltage source 2 is changed so that the velocity of the electron waves under electrode 2 is changed, the focal point of the structure will be changed from F1 to F2 or F3. By locating ohmic collector contacts at focal points F1-F3 and by changing the potential on electrode 2, current may be applied to any selected electrode. This result is opposite from Snell's Law for photons which shows that a biconcave lens causes light to diverge.

In FIG. 1, if no potential is applied from voltage source 3, injected electrons in their wave-like regime will pass under electrode 2, encounter no potential barrier and pass with no velocity changes to an output electrode (not shown). If the applied potential is very high and the resulting potential barrier is higher than that of the energy of the injected electrons, the electron waves will be totally reflected from the potential barrier. Under such circumstances, the device is essentially nonconducting. Thus, by controlling the potentials on electrode 2, high speed switching can take place since all the elements involved take up a path length which is less than the mean free path of a carrier (electron or hole) in a semiconductor such as gallium arsenide. The passage of a carrier to a collector electrode is essentially ballistic under these conditions and switching speeds can be in the subnanosecond range. Also, by changing the angle at which electrons are injected, electron waves will encounter the interface of the potential barrier at different angles of incidence than when they were injected parallel to axis 5. The electron waves, under such circumstances, have their focal point on an axis which is disposed at an angle with respect to axis 5. Then, by changing the potential on electrode 2, the focal point will move along the thus displaced axis.

Figure 2:
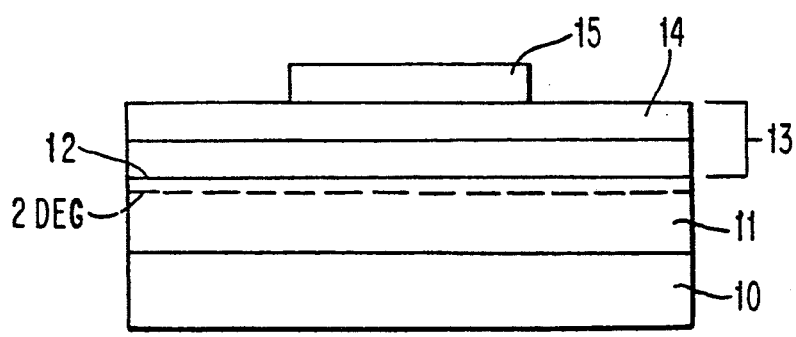
FIG. 2 is a cross-sectional view taken along line 2—2 of FIG. 1 of a preferred embodiment of the present invention.

FIG. 2 shows a cross-sectional view taken along line 2—2 of FIG. 1 of a structure which is preferably used in the practice of the present application. While a single doped semiconductor layer disposed on a substrate may be utilized in the practice of the present application, constraints, such as scattering which limit the length over which electrons are ballistic, form structures which include a two-dimensional carrier gas; the preferred medium because of the resulting advantages in mobility and speed.

Thus, FIG. 2 shows a layer 10 of a semiconductor, such as undoped gallium arsenide. Layer 11 is an epitaxial layer of semiconductor, such as undoped gallium arsenide, which forms a heterojunction 12 with an epitaxially deposited layer 13 of gallium aluminum arsenide. Layer 13 has a highly doped upper portion 14 which is doped with Si to a concentration of $10^{18}$ atom $cm^{-3}$. The properties of the structure are such that a potential well containing a two-dimensional electron gas (2-DEG) exists adjacent heterojunction 12 in undoped layer 11. An electrode 15 having a shape similar to electrode 2 in FIG. 1 is disposed atop layer 13. The 2-DEG adjacent heterojunction 12 has the form of a sheet of electrons which acts as a channel for injected electrons. The latter can travel ballistically from injection to collection under shaped electrode 15 provided the distance traveled is of the order of the mean free path of an electron in gallium arsenide or less. While gallium arsenide and gallium aluminum arsenide have been shown hereinabove as preferred semiconductor materials, it should be appreciated that other Group III-V compound semiconductor materials may be used utilized to form layers 11 and 13 provided that layer 13 has a higher bandgap than layer 11. The 2-DEG is formed at the interface between the two materials in the lower bandgap material, GaAs, due to the separation of electrons from their parent impurities. The higher band gap material AlGaAs, doped with n-type impurity has an excess of electrons which are transferred to and collected at heterojunction 12 in GaAs layer 11. At this juncture, it should be appreciated that the two-dimensional carrier gas may be either a 2-DEG or a two-dimensional hole gas. To obtain a two-dimensional hole gas adjacent heterojunction 12 in layer 11, layer 13 need only be doped with a p-type dopant to provide the excess holes needed.

Figure 3:
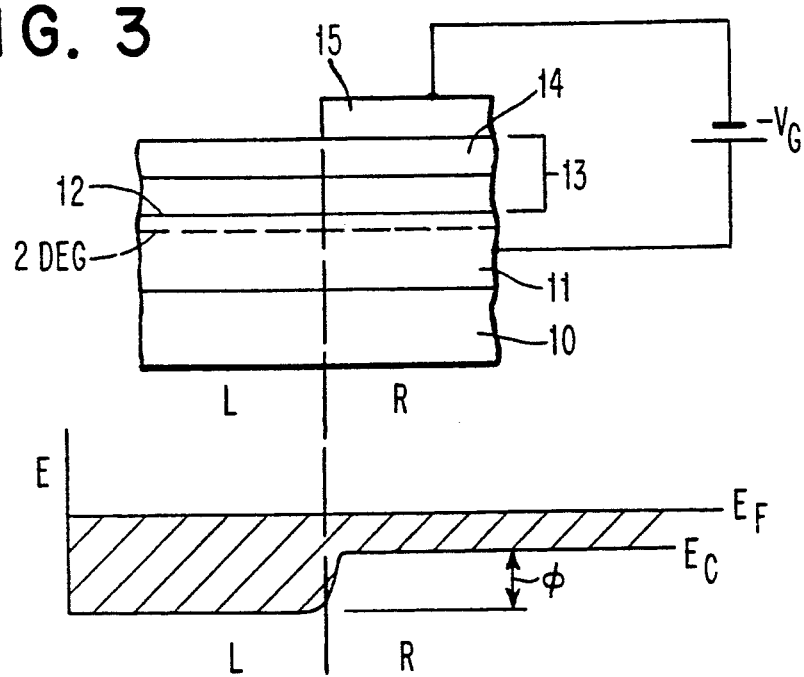
FIG. 3 is a portion of the cross-sectional view of FIG. 2 which further includes a source of potential connected to the 2-DEG and the shaped electrode. An energy diagram correlated with the structure illustrates the principles of the invention.

FIG. 3 shows a portion of the cross-sectional view of FIG. 2 further including a source of potential and an energy diagram correlated with the structure illustrating the principles of the invention. The reference characters utilized in FIG. 2 identify the same elements in FIG. 3.

In FIG. 3, a source of negative voltage, $-V_G$, is shown applied to shaped electrode 15 and the 2-DEG disposed adjacent heterojunction 12 in GaAs layer 11. The associated energy diagram shows the Fermi level, $E_F$, and the conduction band edge energy, $E_C$, correlated with the structure immediately above it. When a negative voltage is applied to electrode 15, the conduction band edge under electrode 15 is raised by a height, $\Phi$, toward the Fermi level, $E_F$ The height, $\Phi$, is proportioned to the potential, $V_G$, applied to electrode 15. Electrons at the Fermi energy, $E_F$, or others injected at higher energy, E, will pass through a potential barrier as they enter the region under electrode 15. Their kinetic energy and thus their velocity is reduced and they will follow the rules described hereinbelow in conjunction with FIG. 4.

The biconcave electrode 2 of FIG. 1, for example, deposited over the 2-DEG of FIG. 3 focuses the ballistic electrons passing underneath electrode 2 in the manner discussed hereinabove in connection with FIG. 1. As indicated above, the focal length is changed as a function of the voltage on electrode 2 which changes the barrier height, $\Phi$, and consequently, the "effective index of refraction". Thus, the index of refraction $n \sim \sqrt{E_K}$, where $E_K$ is the kinetic energy of the electrons.

If an electron with an energy E, traverses the potential barrier from left (L) to right (R) in FIG. 3, the total energy, E, and the tranverse momentum, $k_y$, are conserved in their passage.

Thus, $k_y^L = k_y^R$ and $$E = \frac{h^2 k_L^2}{2m} = \frac{h^2 k_R^2}{2m} + \Phi \tag{1}$$

where
E = Total energy
h = Reduced Planck's constant
k = wave vectors at the Fermi surface
m = effective mass of an electron
$\Phi$ = Potential Energy on the Right Then, because $k_y^L = k^L \sin \theta_L$, $k_y^R = k^R \sin \theta_R$, from equation (1) $k^L \sin \theta_L = k^R \sin \theta_R$.

Also, from equation (1) above, $$k^L = \sqrt{\frac{2mE}{h^2}}$$

$$k^R = \sqrt{\frac{2m(E - \Phi)}{h^2}}$$

therefore, $$\frac{\sin \theta_L}{\sin \theta_R} = \sqrt{\frac{E - \Phi}{E}}$$

but
$E - \Phi < E$
and hence $$\theta_L < \theta_R \tag{2}$$

Figure 4:
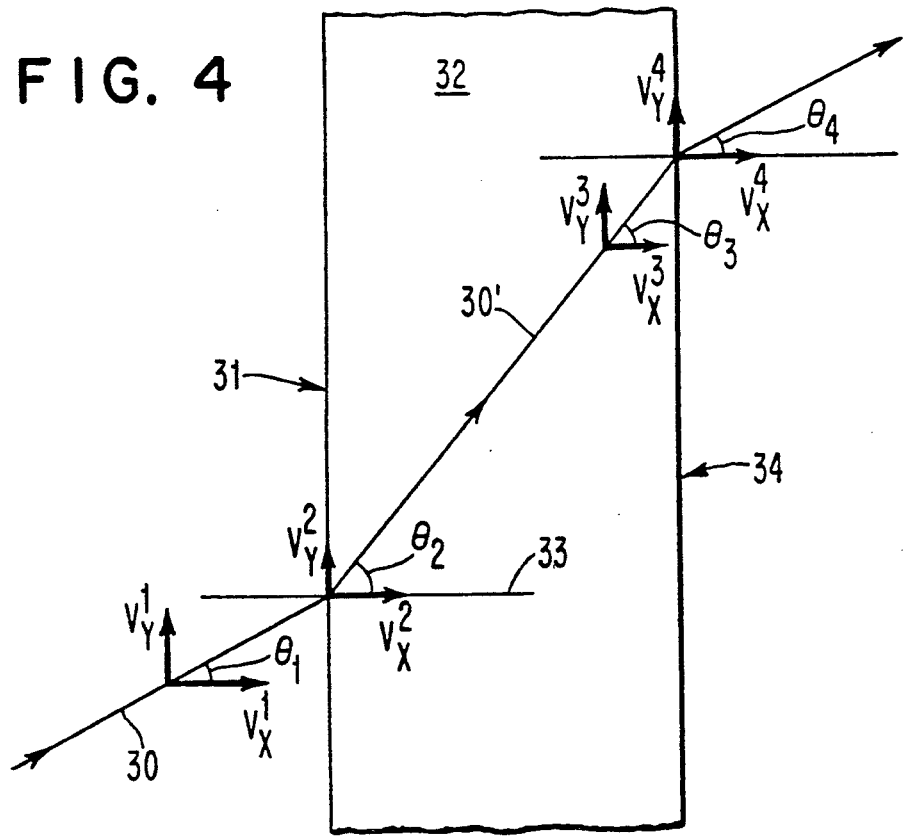
FIG. 4 is a schematic diagram in which an electron wave is shown crossing two interfaces of a potential barrier provided by an overlying electrode and the diagram shows the effect of a potential barrier on an electron wave as it encounters on potential barrier interface and exits from another interface.

This relationship can be more clearly understood by considering FIG. 4 in which an electron wave 30 of given energy is shown travelling toward an interface 31 of an induced potential barrier provided by an electrode 32. Electron wave 30 can be resolved into components $v_y$ and $v_x$ and the angle of the resultant is $\theta_1 = v_y^1/v_x^1$. Electron wave 30 impinges on interface 31 at the angle $\theta_L$ with respect to an axis 33 drawn perpendicularly to interface 31. The resolved components $v_y^l$, $v_x^l$ are each acted on in a different way as they encounter potential barrier interface 31. Upon impingement, the $v_y^l$ component which is parallel to interface 31 is left unchanged while, the $v_x^l$ component which is perpendicular to interface 31 has its energy reduced. The resultant of the new components which is the now modified electron wave 30' leaves interface 31 at an angle $\tan \theta_2 = v_y^2/v_x^2$, which is greater than the angle of incidence $\theta_1$ and conforms to the result shown in (2) hereinabove. To the extent that the foregoing will hold true for any electron wave impinging on an interface wherein the interface is a potential barrier, if the potential barrier presents exactly the same conditions to each impinging electron wave, the $v_y$ and $v_x$ components thereof will each be affected in the same way and the only effect will be that all the electron waves will have their directions changed by the same amount. To the extent that it is the energy component perpendicular to the interface which is always reduced when an electron wave encounters a potential barrier while the component parallel to the interface remains substantially unchanged, the tangent $\theta_2 = v_y^2/v_x^2$ is always greater than tangent $\theta_1 = v_y^1/v_x^1$.

Once the electron wave is in the region of the potential barrier, its kinetic energy and velocity are reduced. The wave then passes out from the potential barrier via interface 34 and its kinetic energy and velocity are thereby increased. Under such circumstances, the rule developed for electron waves entering a potential barrier reverses and the angle $\theta_4$ at which a wave leaves the potential barrier via interface 34 is always smaller than the angle $\theta_3$ at which wave encounters the potential barrier at interface 34. This can be understood by appreciating that the component $v_y$ parallel to the barrier interface again remains unchanged while the component $v_x$ perpendicular to the barrier interface, now experiences an increase in energy and, as a result, the angle of the electron wave departing from the potential barrier interface is always less then the angle at which it impinged upon the potential barrier interface. From the foregoing then, it can be seen, for example, that a biconvex gate will cause electron waves travelling parallel to the axis of the gate to diverge since, the tangents to the points at which the waves strike the first potential barrier interface are aligned in such a way that waves on either side of the axis are deflected away from the axis. These waves, in turn, impinge on the oppositely curved interface, leaving the second potential barrier interface and are further deflected away from the axis porviding an arrangement which causes the incoming electron waves to diverge.

With a biconcave gate like that shown in FIG. 1, electron waves travelling parallel to the axis of the gate encounter a first potential barrier interface. The tangents to points on the barrier are such that waves on either side of the axis are deflected toward the axis. These waves, in turn, impinge on the oppositely curved second barrier potential interface and are further deflected toward the gate axis providing an arrangement which causes the incoming electron waves to converge. By controlling the slopes of the tangents to points on the potential barriers where electron waves impinge, the electron waves may be focused to a point. Then, by adjusting, the height of the potential barrier by adjusting the voltage on the gate, the point at which the electron waves focus may be changed. If the height of the potential barrier is sufficiently great, the impinging electron waves will, of course, be totally reflected.

From the foregoing, it should be clear that electron waves can be caused to converge or diverge by simply controlling the slopes of the potential barriers induced in the semiconductor materials by a gate electrode which has a shape similar to the shape of the potential barrier it induces. Since different points across the width of the potential barrier have different slopes, the variation in slope determines the curvature of the potential barrier which, in turn, is determined by the curvature of the overlying barrier inducing electrode.

Figure 5:
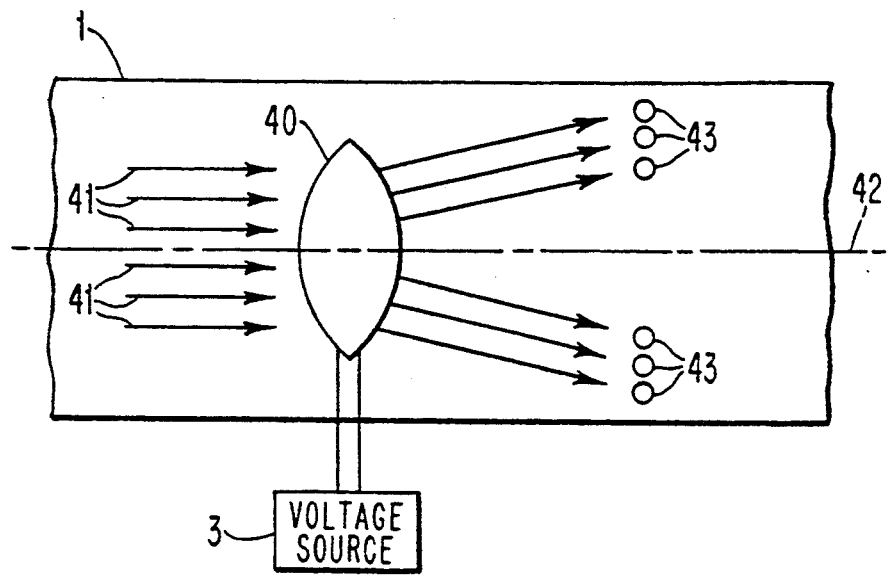

FIG. 5 shows a top view of a metallic electrode 40 having a biconvex shape which may be substituted for the biconcave shaped electrode of FIG. 1. in FIG. 5, arrows 41 which represent electron waves injected into semiconductor layer 1 or into an underlying 2-DEG like that shown in FIG. 2, are oriented parallel to the axis 42 of biconvex electrode 40 and impinge on the potential barrier interface of the same biconvex curvature in that manner. However, instead of focusing like light rays in a biconvex lens, the electron waves diverge from axis 42 at angles which are a function of the voltage applied from voltage source 3 and the slopes of the various points of the potential barrier at which waves impinge. An electrode, like biconvex electrode 40, may be used to supply current simultaneously to a plurality of collector electrodes which are disposed on the end of semiconductor substrate 1 and, switching may be accomplished by applying a potential greater than the energy of the electron waves to cause their complete reflection. In applications where a number of outputs must be served, ohmic contacts 43 may be lined up as shown in FIG. 5 so that a plurality of outputs may be obtained from a single input.

At this point, it should be clear that using electrodes of a desired shape will provide a potential barrier of the same shape and that electron waves impinging on such a shaped field will be focused, diverged, refracted or diffracted depending on the shape of the potential barrier induced and the magnitude and polarity of the applied voltage.

Figure 6:
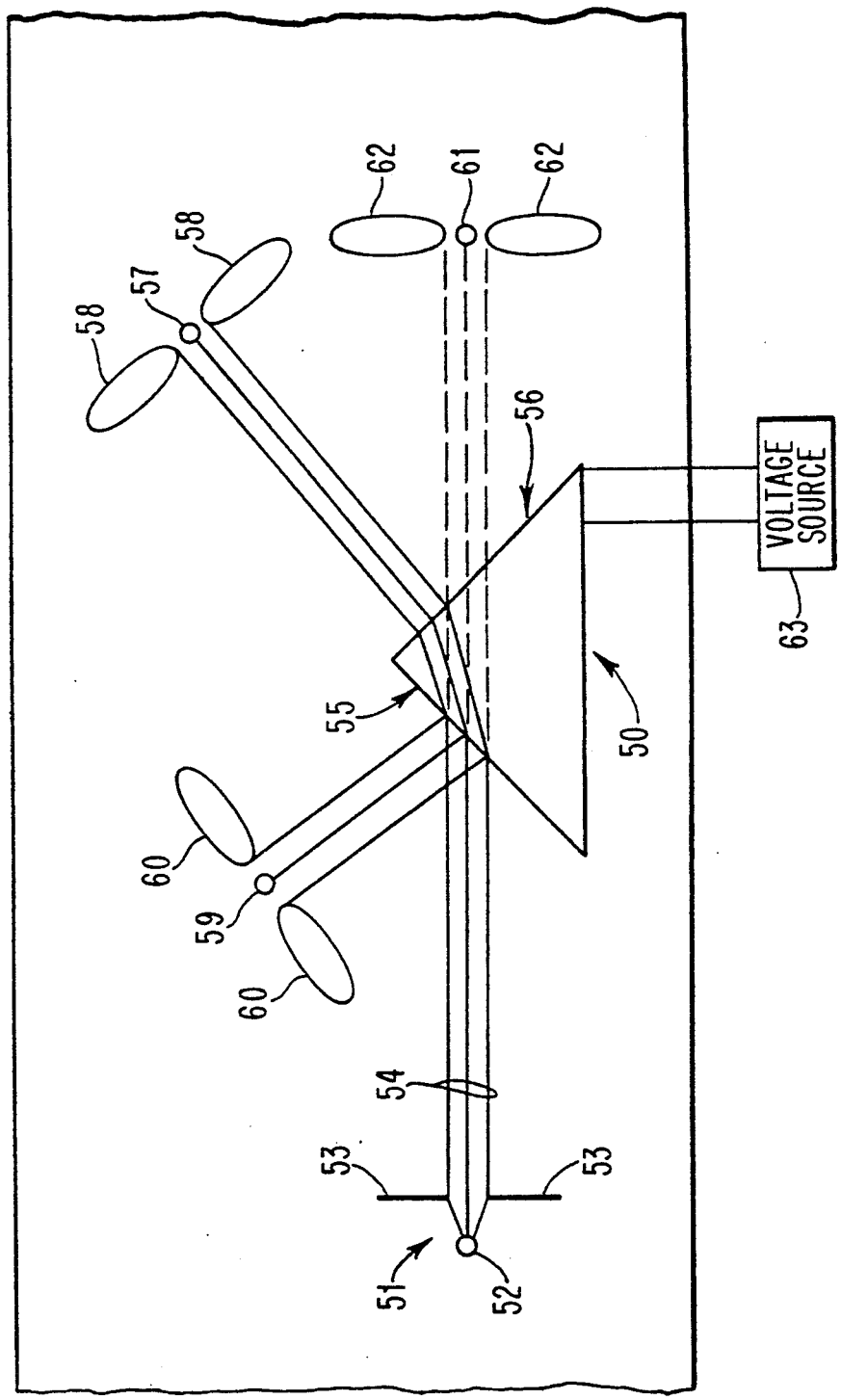
FIG. 6 is a plan view of another embodiment of the present invention which incorporates a triangular potential barrier provided by an electrode of the same shape.

FIG. 6 shows a plan view of another embodiment of the present invention which incorporates a triangular potential barrier provided by a triangular electrode. By applying appropriate potentials to the electrode, elctron waves may be transmitted without deflection, transmitted with deflection or totally reflected. In this way, currents may be applied to appropriately positioned collector electrodes which act as inputs to other circuits.

In more detail FIG. 6 is similar to FIG. 1 except that the electrode 50 has the shape of a triangular instead of the biconcave shaped electrode 2 of FIG. 1. Also shown in FIG. 6 is a collimator arrangement 51 consisting of an ohmic contact 52 from which electron waves emanate in radial fashion. A pair of electrodes 53 disposed adjacent contact 52 collimates the electron waves such that they form a plurality of parallel electron waves 54. The latter impinge on the potential barrier interface 55 provided by a source of voltage 56 connected to electrode 50. To the extent that the potential barrier has an energy value lower than that of the electron waves, waves 54 will be deflected pursuant to the rule described hereinabove in connection with FIG. 4, for electron waves in that waves 54 encounter a shaped potential having at least one interface 55 with a slope sufficient to deflect impinging electron waves 54. The thus deflected electron waves 54 pass under electrode 50 and, in exiting from it, encounter another potential barrier interface 56 which, depending on its slope, further deflects electron waves 54 to an ohmic collector contact 57. The latter is an ohmic contact which is connected to the 2-DEG in the instance of a heterojunction device or to the doped semiconductor in a single semiconductor layer device. Restrictor electrodes 58 disposed adjacent contact 57 have a potential applied thereto which depletes the underlying doped semiconductor region or 2-DEG of carriers to insure that current flows to contact 57.

FIG. 6 also shows another ohmic contact 59 positioned on the same side of electrode 50 as collimator electrodes 53, which responds to electron waves 54 which are reflected from interface 55 when the potential barrier is higher than the energy of electron waves 54. Contact 59 also includes restrictor electrodes 60. Still another ohmic contact 61 including restrictor electrodes 62 is shown in FIG. 6 which is disposed in such a way that when not potential is applied to electrode 50, waves 54 pass directly from contact 52 to collector contact 61 without deflection. From the foregoing, it should be clear that electron waves may be deflected or reflected or permitted to pass undeflected depending on the potential applied from a variable votlage source 63 connected to electrode 50. The potential applied to restrictor electrodes 53, 58, 62 from a source (not shown) should be of sufficient magnitude to insure that the regions beneath them are depleted of carriers.

Figure 7:
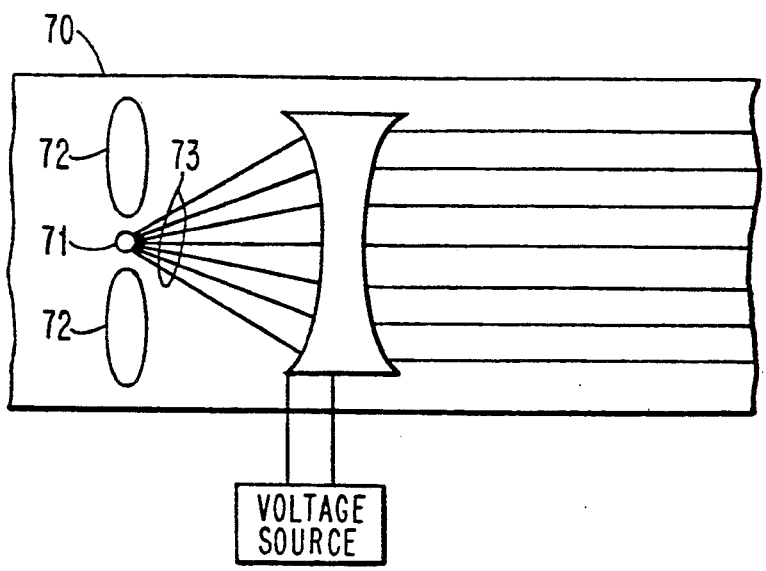
FIG. 7 is a plan view of a semiconductor substrate which incorporates a sructure which permits electron waves emanating from a point source to become parallel.

FIG. 7 is plan view showing an arrangement which permits electron waves emanating from a point source to become parallel.

In FIGS. 1, 5, electron waves 4, 41, respectively, are shown as a plurality of electron waves moving in parallel before encountering the potential barrier formed by shaped electrodes 1, 40, respectively. FIG. 7 shows a structure 70 which may be a single layer of a dopted semiconductor or a heterojunction structure having a cross section like that shown in FIG. 2. An ohmic contact 71 connected to a source of current (not shown) has a pair of restrictors 72 connected to a source of potential (not shown). The latter deplete the semiconductor regions beneath them so that electron waves 73 emanate from the former in radial fashion. Waves 73 are directed to the interfaces of a biconcave potential barrier provided by biconcave shaped electrode 75. The interaction deflects waves 73 such that they exit from the potential barrier as a plurality of parallel electron waves. The potential applied from source 74 can be of fixed value. From the foregoing, it should be clear that the arrangement of FIG. 7 can be coupled with the arrangements of FIGS. 1, 4 to provide the desired parallel electron waves as inputs to the lens-like shaped potential barriers.

All of the FIGS. showing the various embodiments are schematic to some extent in that they do not suggest the scale of the various elements involved. All of the lengths, widths and thickness involved can be characterized in angstrom units and fabrication is carried out using integrated circuit techniques. Thus, deposition of the various semiconductor layers may be carried out by the well-known Molecular Beam Epitaxy (MBE) technique. The shaped electrodes and restrictor electrodes may be of any appropriate metal such as gold-germanium nickel which is deposited on the GaAs surface by evaporation. The deposited layer is shaped as desired by well-known photolithographic masking and etching techniques which may include metal lift-off. Restrictor electrodes of aluminum or titanium-gold may be formed in a similar fashion. Finally, ohmic contacts such as the well-known gold-germanium-nickel (AuGeNi) contacts may be used in conjunction with III-V compound semiconductors like gallium arsenide. Operations of the devices may be carried out at liquid helium temperatures to maximize the mean free path length of carriers in the semiconductors used.

In a typical device such as that shown in FIG. 1, biconcave electrode 2 would vary from 5000 Angstroms at its thickest 2000 Angstroms at its thinnest. A typical distance from input to output would be about 2 microns at 4.2° K. A voltage of between −0.2−−0.5 volts would be applied to gate electrode.

Having thus described our invention what we claim as new and desire to secure as Letters Patent, is:

1. A solid state device for controlling the deflection of carrier waves comprising:
    at least a layer of doped semiconductor material,
    means connected to said device for launching carrier waves in said layer, and,
    means disposed on said layer for inducing a shaped potential barrier into said layer, said shaped potential barrier having at least one interface with at least a slope relative to carrier waves inpinging thereon which deflects carrier waves transiting said barrier.

2. A solid state device according to claim 1 wherein said means for inducing a shaped potential barrier includes an electrode disposed on said layer, said electrode having a biconvex shape.

3. A solid state device according to claim 1 wherein said means for inducing a shaped potential barrier includes an electrode disposed on said layer, said electrode having a biconcave shape.

4. A solid state device according to claim 1 wherein said means for inducing a shaped potential barrier includes an electrodes disposed on said layer, said electrode having the shape of a triangle.

5. A solid state device according to claim 1 further including means connected to said means for inducing a shaped potential barrier for controlling the height of the induced potential barrier.

6. A solid state device according to claim 1 wherein said means for inducing a shaped potential barrier includes an electrode disposed on said layer, said electrode having a shape which causes said impinging carrier waves to diverge.

7. A solid state device according to claim 1 wherein said means for inducing a shaped potential barrier includes an electrode disposed on said layer, said electrode having a shape which causes said impinging carrier waves to converge to a point.

8. A solid state device according to claim 1 wherein said doped semiconductor material is gallium arsenide doped with silicon.

9. A solid device according to claim 1 wherein said means for launching carrier waves includes an ohmic contact to said semiconductor layer and constriction means disposed adjacent said ohmic contact for depleting said semiconductor layer of carriers such that carrier waves emanate radially from said contact toward said shaped potential barrier and another shaped electrode interposed between said ohmic contact and said means for inducing another shaped potential barrier in said semiconductor layer, said another shaped potential barrier having a biconcave shape to launch a plurality of parallel carrier waves.

10. A solid state device according to claim 1 further including an ohmic collector contact to said semiconductor layer disposed relative to said means for inducing a shaped potential barrier so as to intercept at least a portion of said deflected carrier waves.

11. A solid state device according to claim 1 wherein said means for inducing a shaped potential barrier is a metal electrode disposed on the surface of said semiconductor layer.

12. A solid device according to claim 5 wherein said means for controlling the height of the induced potential barrier includes a voltage source variable over a voltage range.

13. A solid state device for controlling the deflection of carrier waves comprising:
   at least a lyer of doped semiconductor material,
   means connected to said device for launching carrier waves in said layer along a given path,
   means disposed on said layer for inducing a shaped potential barrier into said layer, said shaped potential barrier having at least one interface with a curvature which deflects inpinging carriers.

14. A solid state device according to claim 13 wherein said means for inducing a shaped potential barrier includes an electrode disposed on said layer, said electrode having a biconvex shape.

15. A solid device according to claim 13 wherein said means for inducing a shaped potential barrrier includes an electrode disposed on said layer, said electrode having a biconcave shape.

16. A solid state device according to claim 13 further including means connected to said means for inducing a shaped potential barrier for controlling the height of the induced potential barrier.

17. A solid state device according to claim 13 wherein said means for inducing a shaped potential barrier includes an electrode disposed on said layer, said electrode having a shape which causes said impinging carrier waves to diverge from said given path.

18. A solid state device according to claim 13 wherein said means for inducing a shaped potential barrier includes an electrode disposed on said layer, said electrode having a shape which causes said impinging carrier waves to converge to a point on said given path.

19. A solid state device according to claim 13 wherein said doped semiconductor material is gallium arsenide doped with silicon.

20. A solid state device according to claim 13 wherein said means for launching carrier waves includes an ohmic contact to said semiconductor layer and constriction means disposed adjacent said ohmic contact for depleting said semiconductor layer of carriers such that carrier waves emanate radially from said contact toward said shaped potential barrier and another shaped electrode interposed between said ohmic contact and said means for inducing another shaped potential barrier in said semiconductor layer, said another shaped potential barrier having a biconcave shape to launch a plurality of parallel carrier waves.

21. A solid state device according to claim 13 further including an ohmic collector contact to said semiconductor layer disposed relative to said means for inducing so as to intercept at least a portion of said deflected carrier waves.

22. A solid state device according to claim 13 wherein said means for inducing a shaped potential barrier is a metal electrode disposed on the surface of said semiconductor layer.

23. A solid state device according to claim 16 wherein said means for controlling the height of the induced potential barrier includes a voltage source variable over a voltage range and carrier.

24. A solid state device for controlling the deflection of carrier waves comprising:
   a layer of undoped semiconductor material of one bandgap disposed on a doped semiconductor substrate,
   a layer of semiconductor material of higher bandgap than said layer of undoped semiconductor material having a doped upper portion forming a heterojunction with said one bandgap semiconductor layer, a two-dimensional carrier gas being formed in said layer of undoped semiconductor material adjacent said heterojunction,
   means connected to said device for launching carrier waves in said two-dimensional carrier gas, and,
   means disposed on said layer for inducing a shaped potential barrier into said layers of semiconductor material, said shaped potential barrier having at least one interface with at least a slope which deflects impinging carrier waves that transit said barrier.

25. A solid state device according to claim 24 wherein said means for inducing a shaped potential barrier includes an electrode disposed on said layer, said electrode having a biconvex shape.

26. A solid state device according to claim 24 wherein said means for inducing a shaped pontential barrier includes an electrode disposed on said layer, said electrode having a biconcave shape.

27. A solid state device according to claim 24 wherein said means for inducing a shaped potential barrier includes an electrode disposed on said layer, said electrode having the shape of triangle.

28. A solid state device according to claim 24 further including means connected to said means for inducing a shaped potential barrier for controlling the height of the induced potential barrier.

29. A solid state device according to claim 24 wherein said means for inducing a shaped potential barrier includes an electrode disposed on said layer, said electrode having a shape which causes said impinging carrier waves to diverge.

30. A solid state device according to claim 24 wherein said means for inducing a shaped potential barrier includes an electrode disposed on said layer, said electrode having a shape which causes said impinging carrier waves to converge to a point.

31. A solid state device according to claim 24 wherein said layer of one bandgap semiconductor material is gallium arsenide.

32. A solid state device according to claim 24 wherein said means for launching carrier waves includes an ohmic contact to said two-dimensional carrier gas and constriction means disposed adjacent said ohmic contact for depleting said two-dimensional carrier gas of carriers such that carrier waves emanate radially from said contact toward said shaped potential barrier and another shaped electrode interposed between said ohmic contact and said means for inducing another shaped potential barrier in said semiconductor layer, said another shaped potential barrier having a biconcave shape to launch a plurality of parallel carrier waves in said two-dimensional carrier gas.

33. A solid state device according to claim 24 further including an ohmic collector contact to said semiconductor layer disposed relative to said means for inducing so as to intercept at least a portion of said deflected carrier waves.

34. A solid state device according to claim 24 wherein said means for inducing a shaped potential barrier is a metal electrode disposed on the surface of said semiconductor layer.

35. A solid state device according to claim 24 wherein said two-dimensional carrier gas is a two-dimensional electron gas.

36. A solid state device according to claim 24 wherein said two-dimensional carrier gas is a two-dimensional hole gas.

37. A solid state device according to claim 24 wherein said semiconductor material of higher bandgap than said layer of undoped semiconductor material is gallium aluminum arsenide, the doped upper portion of which is doped with silicon.

38. A solid state device according to claim 28 wherein said means for controlling the height of the induced potential barrier includes a voltage source variable over a voltage range carrier.

39. A solid state device for controlling the deflection of carrier waves comprising:
- a layer of undoped semiconductor material of one bandgap disposed on a doped semiconductor substrate,
- a layer of semiconductor material of higher bandgap than said layer of undoped semiconductor material having a doped upper portion forming a heterojunction with said one bandgap semiconductor layer, a two-dimensional carrier gas being formed in said layer of undoped semiconductor material adjacent said heterojunction,
- means connected to said device for launching carrier waves in said two-dimensional carrier gas, and,
- means disposed on said layer for inducing a shaped potential barrier into said layers of semiconductor material, said shaped potential barrier having at least one interface with a curvature which deflects impinging carriers that transit said barrier.

40. A solid state device for controlling the deflection of carrier waves comprising:
- at least a layer of doped semiconductor material,
- means connected to said device for launching carrier waves along a given path in said layer,
- means disposed on said layer for inducing a shaped potential barrier into said layer, said shaped potential barrier having at least one interface with a curvature which deflects impinging carriers from said given path.

41. A solid state device for controlling the deflection of carrier waves comprising:
- a layer of undoped semiconductor material of one bandgap disposed on a doped semiconductor substrate,
- a layer of semiconductor material of higher bandgap than said layer of undoped semiconductor material having a doped upper portion forming a heterojunction with said one bandgap semiconductor layer, a two-dimensional carrier gas being formed in said layer of undoped semiconductor material adjacent said heterojunction,
- means connected to said device for launching carrier waves in said two-dimensional carrier gas along a given path, and,
- means disposed on said layer for inducing a shaped potential barrier into said layers of semiconductor material, said shaped potential barrier having at least one interface with at least a slope which deflects impinging carriers which transit said barrier from said given path.

42. A solid state device for controlling the deflection of carrier waves comprising:
- at least a layer of doped semiconductor material,
- means connected to said device for launching carrier waves along a given path in said layer,
- means disposed in said given path for inducing a shaped potential barrier into said semiconductor layer, said shaped potential barrier having at least one interface with at least a slope which deflects impinging waves carrier which transit said barrier from said given path.

43. A solid state device according to claim 1 wherein said carrier waves are electron waves.

44. A solid state device according to claim 1 wherein said carrier waves are hole waves.

45. A solid state device according to claim 24 wherein said carrier waves are electron waves.

46. A solid state device according to claim 24 wherein said carrier waves are hole waves.

* * * * *